(12) United States Patent
Shimizu

(10) Patent No.: US 10,965,119 B2
(45) Date of Patent: Mar. 30, 2021

(54) SEMICONDUCTOR DEVICE

(71) Applicant: Fuji Electric Co., Ltd., Kanagawa (JP)

(72) Inventor: Naoki Shimizu, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 101 days.

(21) Appl. No.: 16/405,516

(22) Filed: May 7, 2019

(65) Prior Publication Data

US 2019/0356128 A1 Nov. 21, 2019

(30) Foreign Application Priority Data

May 18, 2018 (JP) ............................. JP2018-096267

(51) Int. Cl.
| | | |
|---|---|---|
| *H02H 7/20* | (2006.01) | |
| *H02H 1/00* | (2006.01) | |
| *G08B 21/18* | (2006.01) | |
| *H03K 17/081* | (2006.01) | |
| *H03K 17/08* | (2006.01) | |

(52) U.S. Cl.
CPC .......... *H02H 7/205* (2013.01); *G08B 21/182* (2013.01); *H02H 1/0007* (2013.01); *H03K 17/08116* (2013.01); *H03K 2017/0806* (2013.01)

(58) Field of Classification Search
CPC .... H02H 7/205; H02H 1/0007; G08B 21/182; H03K 17/08116; H03K 2017/0806; H03K 17/14; H03K 17/145; H03K 19/00369
See application file for complete search history.

(56) References Cited

U.S. PATENT DOCUMENTS

| | | | | |
|---|---|---|---|---|
| 6,061,221 A | * | 5/2000 | Tihanyi | ............. H03K 17/0822 361/103 |
| 6,411,484 B1 | * | 6/2002 | Tihanyi | .................... G01K 7/01 257/E23.08 |
| 6,459,380 B1 | | 10/2002 | Watanabe et al. | |
| 6,628,491 B1 | * | 9/2003 | Tihanyi | .................... H02H 5/04 361/103 |
| 2017/0019092 A1 | | 1/2017 | Taoka | |
| 2017/0033783 A1 | * | 2/2017 | Rahman | ............. H03K 17/0822 |
| 2020/0343885 A1 | * | 10/2020 | Braun | .................... H02H 5/044 |

FOREIGN PATENT DOCUMENTS

| | | | |
|---|---|---|---|
| JP | 3635988 B2 | 4/2005 | |
| WO | 2016/052011 A1 | 4/2017 | |

* cited by examiner

*Primary Examiner* — Gary L Laxton
(74) *Attorney, Agent, or Firm* — Chen Yoshimura LLP

(57) ABSTRACT

Power cycle life of an intelligent power module that includes an IGBT is estimated by an abnormality detection circuit(s) while a chip temperature detection circuit or a case temperature detection circuit is outputting a chip overheating warning signal or a case overheating warning signal. Once the estimated power cycle life has reached a prescribed value, the abnormality detection circuit outputs an abnormality detection signal to forcedly and permanently stop operation of a driver circuit that drives an IGBT. The abnormality detection circuit may include a prescribed period calculation circuit that calculates the duration of the warning signal, a prescribed count calculation circuit that calculates the number of times the warning signal has been generated, and/or a cumulative time calculation circuit that calculates that the cumulative duration of periods in which the warning signal has been generated so as to estimate the power cycle life of the intelligent power module.

7 Claims, 9 Drawing Sheets

| | Low-temperature operation | Operation at or above prescribed temperature | |
|---|---|---|---|
| | | Counting | Count up |
| Chip overheating warning signal | L | H/L | H |
| DFFn-1 output signal | L | H | L |
| XOR circuit 33 output signal | H | L | H |
| DFF output signal | L | H | H |
| Overheating protection signal | L | L | H |

|  | Low-temperature operation | Operation at or above prescribed temperature | |
|---|---|---|---|
|  |  | Counting | Count up |
| DFFn-1 output signal | L | H | L |
| DFF output signal | L | H | H |
| XOR circuit 33 output signal | H | L | H |
| Overheating protection signal | L | L | H |

FIG. 11

SEMICONDUCTOR DEVICE

BACKGROUND OF THE INVENTION

Technical Field

The present invention relates to a semiconductor device including a power semiconductor device for power conversion and a control integrated circuit (IC) which drives the power semiconductor device and has a feature for protecting the power semiconductor device during abnormal operation thereof.

Background Art

Semiconductor devices known as intelligent power modules (IPMs), in which a power semiconductor device and a control IC are integrated together into the same package, are one known type of device for converting power. Depending on the use case, IPMs sometimes include a plurality of power semiconductor devices. For example, an IPM for driving a three-phase motor includes six power semiconductor devices. Each power semiconductor device is driven and controlled by the control IC.

Moreover, the control IC includes a protection circuit which, upon detecting an abnormality such as overcurrent, overheating, an abnormal decrease in supply voltage, or overheating of the package case, stops the switching operation of the power semiconductor device in order to protect the power semiconductor device from being damaged. There are also protection circuits that not only stop the switching operation of the power semiconductor device upon detecting an abnormality but also have features for detecting that an abnormality may soon occur and sending a notification to the exterior in advance (see Patent Document 1, for example).

The IPM disclosed in Patent Document 1 includes an insulated-gate bipolar transistor (IGBT) as the power semiconductor device, and the IGBT chip includes a diode for detecting temperature. If the temperature of the IGBT chip reaches a warning temperature, the control IC outputs a warning signal to the exterior. If the temperature of the IGBT chip reaches a protection temperature that is higher than the warning temperature, the control IC outputs a protection signal to stop the switching operation of the IGBT and also sends a notification to the exterior. In this way, when the control IC outputs a warning signal, measures such as reducing the drive capacity of the IGBT can be taken to inhibit temperature increases in the IGBT chip and make it possible to continue the switching operation of the IGBT without interruption.

In an IPM, if IGBT temperatures increase and decrease significantly due to the operating conditions, aluminum wire bonds on the surface of the IGBT chip experience heat stress, which results in fatigue on and promotes deterioration of the aluminum wire bonds and sometimes causes defects such as detachment to occur in the bonds. Also, significant increases and decreases in IGBT temperatures cause solder joints between the IGBT chip and insulating substrate as well as solder joints between the insulating substrate and case (copper base) to deteriorate, which can cause malfunctions to occur due to cracking or the like. This lifespan that is determined by heat stress is known as "power cycle life", and as long as the IPM is used within the limits of this power cycle life, IPM reliability can be maintained.

RELATED ART DOCUMENTS

Patent Documents

Patent Document 1: WO 2016/052011

SUMMARY OF THE INVENTION

In a conventional IPM, the switching operation of the IGBT is not stopped even when the control IC outputs a warning signal, and therefore the switching operation of the IGBT is sometimes continued until immediately prior to when a protection signal is output. With this approach, the temperature of the IGBT sometimes increases and decreases while the warning signal is being output, which results in a corresponding increase in the number of heat stress events and a decrease in the power cycle life, thus negatively impacting reliability.

The present invention was made in view of these problems and aims to provide a semiconductor device in which reliability is improved by taking power cycle life during output of warning signals into account.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a power semiconductor device; a control IC including a driver circuit to drive the power semiconductor device and a protection circuit to protect the power semiconductor device; a case that houses the power semiconductor device and the control IC; a chip temperature detector connected to the control IC to measure a chip temperature of the power semiconductor device; and a case temperature detector connected to the control IC to measure a case temperature that is defined as a temperature at a portion of the semiconductor device other than the power semiconductor device, wherein the protection circuit in the control IC includes: a chip temperature detection circuit that, when the chip temperature rises and exceeds a first threshold, outputs a chip overheating warning signal so that a warning is communicated to a user, and, when the chip temperature further rises and exceeds a second threshold higher than the first threshold, outputs a chip overheating protection signal to the driver circuit so as to cause the driver circuit to stop switching operation of the power semiconductor device until the chip temperature returns to normal; a case temperature detection circuit that, when the case temperature rises and exceeds a third threshold, outputs a case overheating warning signal so that a warning is communicated to the user, and, when the case temperature further rises and exceeds a fourth threshold higher than the third threshold, outputs a case overheating protection signal to the driver circuit so as to cause the driver circuit to stop switching operation of the power semiconductor device until the case temperature returns to normal; and an abnormality detection circuit connected to one of the chip temperature detection circuit and the case temperature detection circuit to receive the chip overheating warning signal or the case overheating warning signal, the abnormality detection circuit estimating power cycle life of semiconductor device by processing the received chip or case overheating warning signal, and, when the estimated power cycle life has reached a prescribed threshold, generates and outputs an abnormality detection signal to the driver circuit so as to cause the driver circuit to forcedly and permanently stop the switching operation of the power semiconductor device.

In the semiconductor device configured as described above, including the abnormality detection circuit makes it possible to ascertain a degree of deterioration that would be accelerated by continuing to operate the power semiconductor device at high temperatures prior to when any damage occurs, thereby making it possible to improve reliability.

It is to be understood that both the foregoing general description and the following detailed description are exemplary and explanatory, and are intended to provide further explanation of the invention as claimed.

BRIEF DESCRIPTION OF THE DRAWINGS

FIG. 11 shows the logical values at relevant parts for explaining the operation of the cumulative time calculation circuit.

DETAILED DESCRIPTION OF EMBODIMENTS

Figure 1:
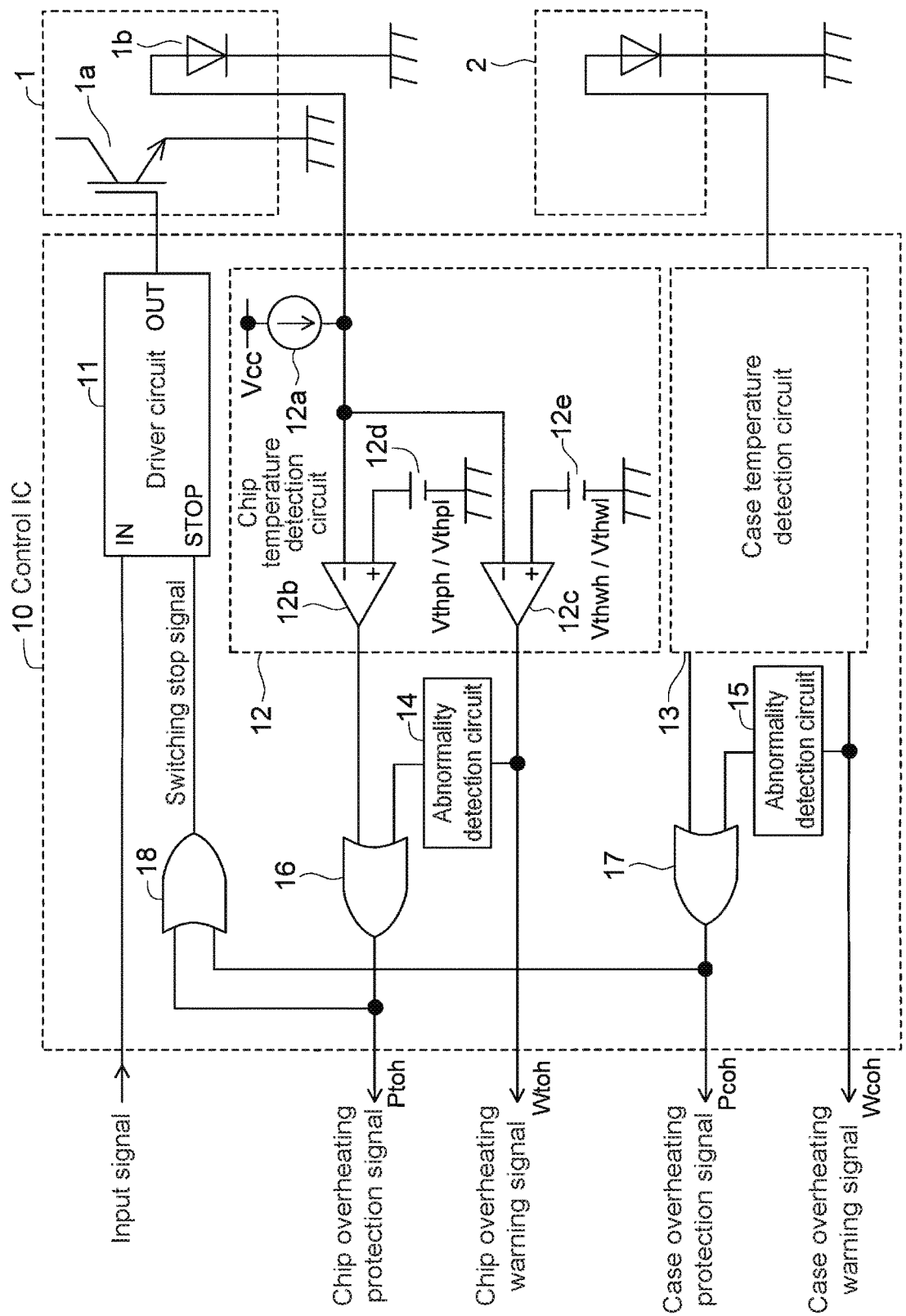
FIG. 1 is a circuit diagram illustrating an example configuration of an IPM which constitutes a semiconductor device according to an embodiment of the present invention.

Next, an embodiment of the present invention as exemplarily applied to an IPM that uses an IGBT as a power semiconductor device will be described in detail with reference to figures. Note that in the figures, portions that have the same reference characters represent the same components. Moreover, in the following description, the same reference characters are sometimes used both to label terminals and to indicate voltages, signals, or the like present at those terminals.

Figure 2:
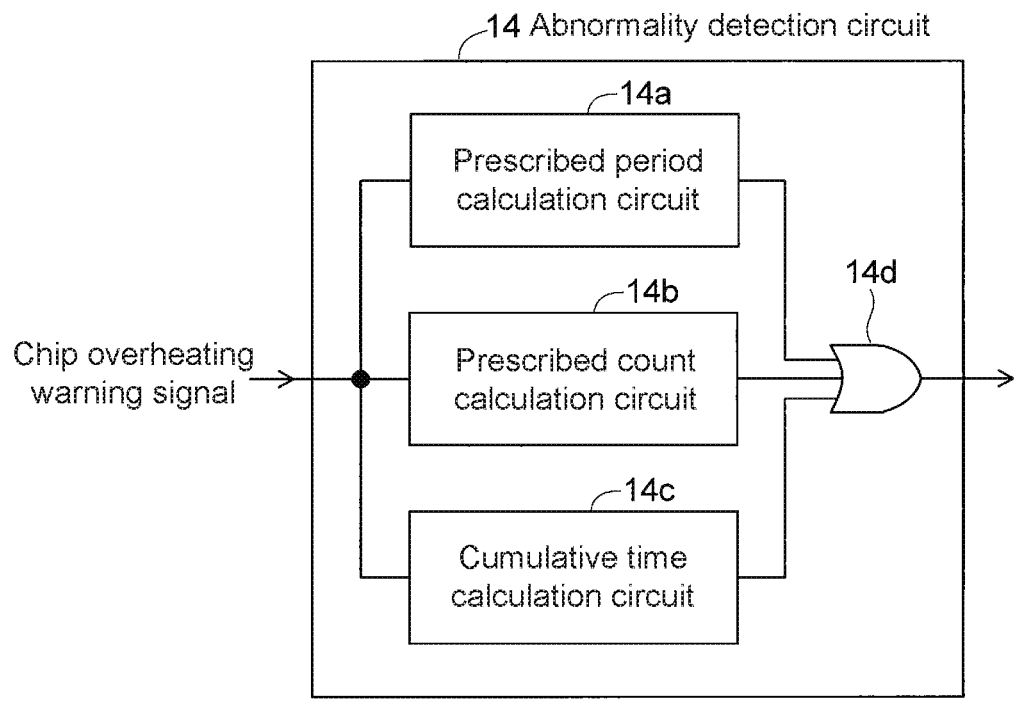
FIG. 2 illustrates an example configuration of an abnormality detection circuit.
Figure 3:
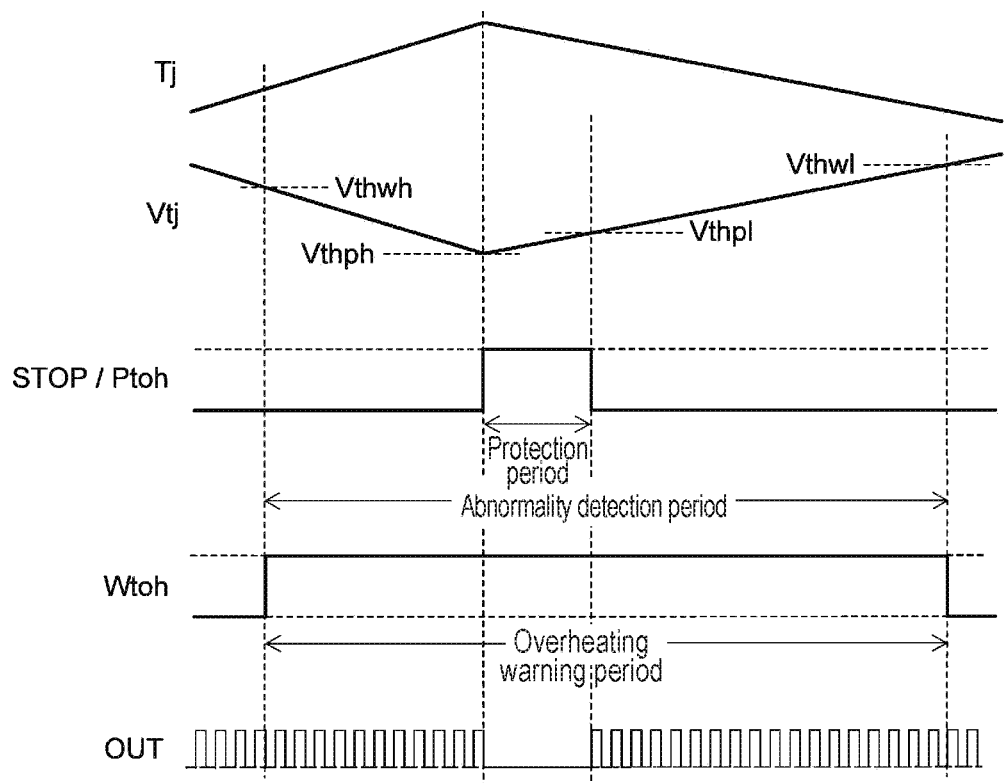
FIG. 3 is a timing chart illustrating the operation of the IPM.

FIG. 1 is a circuit diagram illustrating an example configuration of an IPM which constitutes a semiconductor device according to an embodiment of the present invention. FIG. 2 illustrates an example configuration of an abnormality detection circuit. FIG. 3 is a timing chart illustrating the operation of the IPM.

The IPM illustrated in FIG. 1 includes an IGBT 1, a control IC 10, and a case temperature detector 2. Note that although in this IPM a single IGBT 1 and control IC 10 set is illustrated, the IPM may include a plurality of sets of IGBTs 1 and control ICs 10.

The IGBT 1 includes an IGBT chip 1a and a chip temperature detector 1b arranged on that IGBT chip 1a. Here, a diode is used as the chip temperature detector 1b.

The case temperature detector 2 detects the temperature at a portion of the IPM other than the IGBT chip 1a, such as the temperature of a case that houses the IPM and the control IC 10, and here, a diode is used. Alternatively, a thermosensor such as a thermistor may be used as the case temperature detector 2.

The control IC 10 includes a driver circuit 11. The driver circuit 11 includes an input terminal IN to which an input signal is input, a protection signal input terminal STOP to which a switching stop signal is input, and an output terminal OUT from which a drive signal is output. The output terminal OUT of the driver circuit 11 is connected to a gate terminal of the IGBT chip 1a, and an emitter terminal of the IGBT chip 1a is connected to ground.

The control IC 10 further includes a protection circuit. This protection circuit of the control IC 10 includes a chip temperature detection circuit 12, a case temperature detection circuit 13, a chip abnormality detection circuit 14, a case abnormality detection circuit 15, and OR circuits 16, 17, and 18.

The chip temperature detection circuit 12 includes a constant current circuit 12a, comparators 12b and 12c, and reference voltage sources 12d and 12e. One terminal of the constant current circuit 12a is connected to an internal power supply Vcc, while the other terminal of the constant current circuit 12a is connected to an anode terminal of the chip temperature detector 1b and to the inverting input terminals of the comparators 12b and 12c. A cathode terminal of the chip temperature detector 1b is connected to ground. The non-inverting input terminals of the comparators 12b and 12c are respectively connected to the positive terminals of the reference voltage sources 12d and 12e, and the negative terminals of the reference voltage sources 12d and 12e are connected to ground.

Moreover, the comparators 12b and 12c exhibit hysteresis. Therefore, the reference voltage source 12d has both a protection detection threshold voltage Vthph and a protection deactivation threshold voltage Vthpl, and the reference voltage source 12e has both a warning detection threshold voltage Vthwh and a warning deactivation threshold voltage Vthwl.

The output terminal of the comparator 12b is connected to one input terminal of the OR circuit 16, and the output terminal of the comparator 12c is connected to an input terminal of the chip abnormality detection circuit 14 and to an output terminal Wtoh which outputs a chip overheating warning signal. The other input terminal of the OR circuit 16 is connected to an output terminal of the chip abnormality detection circuit 14, and the output terminal of the OR circuit 16 is connected to an output terminal Ptoh which outputs a chip overheating protection signal as well as to one input terminal of the OR circuit 18. The output terminal of the OR circuit 18 is connected to the protection signal input terminal STOP of the driver circuit 11.

The case temperature detection circuit 13 has the same circuit configuration as the chip temperature detection circuit 12, and therefore the specific internal circuit configuration will not be described here. In other words, an input terminal of the case temperature detection circuit 13 is connected to an anode terminal of the case temperature detector 2, and a cathode terminal of the case temperature detector 2 is connected to ground. An output terminal of the case temperature detection circuit 13 that outputs a case overheating protection signal is connected to one input terminal of the OR circuit 17. An output terminal of the case temperature detection circuit 13 that outputs a case overheating warning signal is connected to an input terminal of the case abnormality detection circuit 15 and to an output terminal Wcoh which outputs the case overheating warning signal. The other input terminal of the OR circuit 17 is connected to an output terminal of the case abnormality detection circuit 15, and the output terminal of the OR circuit 17 is connected to an output terminal Pcoh that outputs a case overheating protection signal as well as to the other input terminal of the OR circuit 18.

The abnormality detection circuit estimates the power life cycle of the IPM by detecting one or more kinds of abnormalities. As illustrated in FIG. 2, the abnormality detection circuit 14 of this embodiment includes a prescribed period calculation circuit 14a, a prescribed count calculation circuit 14b, a cumulative time calculation circuit 14c, and an OR circuit 14d. The input terminals of the prescribed period calculation circuit 14a, the prescribed count calculation circuit 14b, and the cumulative time calculation circuit 14c are connected to the output terminal of the comparator 12c of the chip temperature detection circuit 12. The output terminals of the prescribed period calculation circuit 14a, the prescribed count calculation circuit 14b, and the cumulative time calculation circuit 14c are respectively connected to input terminals of the OR circuit 14d, and the output terminal of the OR circuit 14d is connected to the other input terminal of the OR circuit 16.

Here, the prescribed period calculation circuit 14a outputs a chip overheating protection signal (abnormality detection signal) upon detecting that the chip overheating warning signal has continued for a prescribed period of time. The prescribed count calculation circuit 14b outputs a chip overheating protection signal when the number of times that the chip overheating warning signal has been input reaches a prescribed number of times. Moreover, the cumulative time calculation circuit 14c outputs a chip overheating protection signal when the cumulative duration of periods during which the chip overheating warning signal was input reaches a prescribed amount of time.

In the present embodiment, the abnormality detection circuit 14 includes the prescribed period calculation circuit 14a, the prescribed count calculation circuit 14b, and the cumulative time calculation circuit 14c. However, the abnormality detection circuit 14 may, as necessary, include only the prescribed period calculation circuit 14a, only the prescribed count calculation circuit 14b, or only the cumulative time calculation circuit 14c. In this case, the OR circuit 14d is unnecessary. Moreover, the abnormality detection circuit 14 may include any combination of two circuits among the prescribed period calculation circuit 14a, the prescribed count calculation circuit 14b, and the cumulative time calculation circuit 14c.

The abnormality detection circuit 15 can have the same configuration as the abnormality detection circuit 14. Alternatively, the abnormality detection circuit 15 may include a combination of calculation circuits different from that of the abnormality detection circuit 14.

Next, the operation of the IPM configured as described above will be described with reference to FIG. 3. When the IPM begins to be used, the driver circuit 11 receives an input signal and outputs a pulse signal to the output terminal OUT to switch the IGBT 1 ON and OFF. At this time, the constant current circuit 12a of the chip temperature detection circuit 12 passes a constant current through the chip temperature detector 1b, and the junction temperature Tj of the IGBT chip 1a is monitored by detecting changes in the forward voltage of the chip temperature detector 1b resulting from changes in the temperature of the IGBT chip 1a.

When the junction temperature Tj of the IGBT chip 1a is low, a detected voltage Vtj from the chip temperature detector 1b is higher than the warning detection threshold voltage Vthwh of the reference voltage source 12d, and therefore the comparator 12c outputs a low (L) level signal. As a result, none of the prescribed period calculation circuit 14a, the prescribed count calculation circuit 14b, and the cumulative time calculation circuit 14c calculate power cycle life, and therefore the abnormality detection circuit 14 outputs an L-level signal. At this time, the comparator 12b is also outputting an L-level signal, and therefore no high (H) level switching stop signal is input to the protection signal input terminal STOP of the driver circuit 11, and normal switching operation is continued on the basis of the input signal.

When the junction temperature Tj of the IGBT chip 1a increases and a detected voltage Vtj that is lower than the warning detection threshold voltage Vthwh is input to the inverting input terminal of the comparator 12c, the output signal of the comparator 12c inverts, and an H-level signal is output to the output terminal Wtoh. In this way, the control IC 10 sends a chip overheating warning signal to an external unit via the output terminal Wtoh to provide notification to the external unit that the junction temperature Tj of the IGBT chip 1a has increased to a warning level. At this time, the abnormality detection circuit 14 receives the H-level signal as input and begins calculating power cycle life.

When the junction temperature Tj of the IGBT chip 1a increases further and the detected voltage Vtj that is input to the inverting input terminal of the comparator 12b decreases and reaches the protection detection threshold voltage Vthph, the output signal of the comparator 12b is inverted, and an H-level chip overheating protection signal is output to the output terminal Ptoh. This chip overheating protection signal is also input via the OR circuit 18 to the protection signal input terminal STOP of the driver circuit 11 as a switching stop signal, thereby causing the driver circuit 11 to force-stop the switching operation. During this protection period in which switching operation is stopped, the driver circuit 11 does not output any pulse signal to the output terminal OUT.

Due to the switching operation of the IGBT 1 having been stopped, the junction temperature Tj of the IGBT chip 1a decreases, and when the detected voltage Vtj that is input to the inverting input terminal of the comparator 12b increases and reaches the protection deactivation threshold voltage Vthpl, the output signal of the comparator 12b is inverted. As a result, the outputs of the OR circuits 16 and 18 take the L level, and the driver circuit 11 resumes the switching operation.

When the junction temperature Tj of the IGBT chip 1a decreases further and the detected voltage Vtj that is input to the inverting input terminal of the comparator 12c increases and reaches the warning deactivation threshold voltage Vthwl, the output signal of the comparator 12c is inverted and takes the L level, thus causing the output terminal Wtoh to also take the L level. At this time, the abnormality detection circuit 14 receives this L-level signal as input and ends or suspends calculation of power cycle life.

Meanwhile, if during the overheating warning period in which the comparator 12c is outputting the H-level chip overheating warning signal the abnormality detection circuit 14 calculates (estimates) that the power cycle life has been reached, the abnormality detection circuit 14 outputs an H-level chip overheating protection signal (abnormality detection signal). This chip overheating protection signal is input to the driver circuit 11 via the OR circuits 16 and 18, and therefore regardless of whether the overheating warning period is still ongoing, the driver circuit 11 force-stops (i.e., overrides the chip temperature detection circuit and permanently stops) the switching operation.

The chip overheating warning and chip overheating protection operations performed for the IGBT chip 1a can be applied in a similar manner to case overheating warning and case overheating protection operations performed using the case temperature detector 2, the case temperature detection circuit 13, the abnormality detection circuit 15, and the OR circuit 17. Therefore, a description of the case overheating warning and case overheating protection operations will be omitted here.

In this way, if the abnormality detection circuits 14 and 15 calculate that the power cycle life has been reached during the overheating warning period, the driver circuit 11 force-stops the switching operation, thereby making it possible to further improve the reliability of the IPM.

Next, specific example configurations for the prescribed period calculation circuit 14a, the prescribed count calculation circuit 14b, and the cumulative time calculation circuit 14c included in the abnormality detection circuits 14 and 15 will be described.

Figure 4:
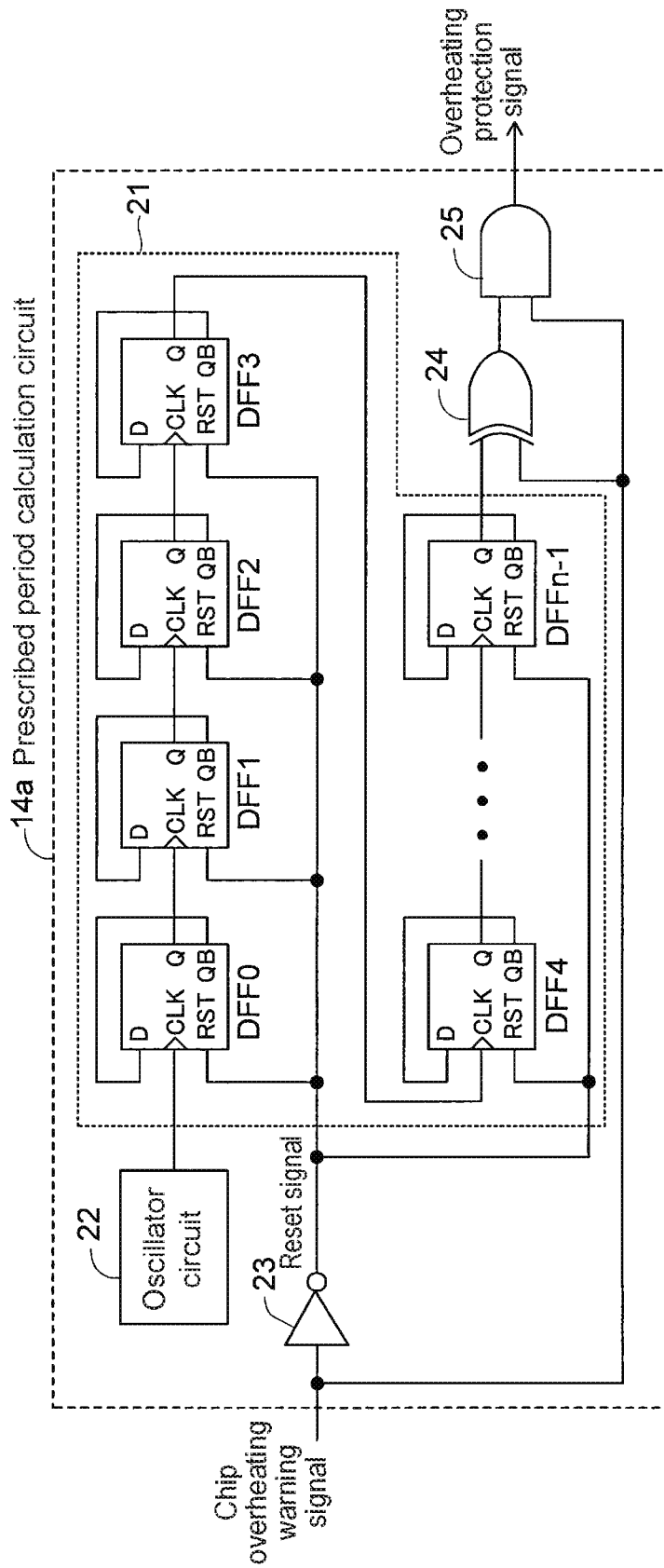
FIG. 4 is a circuit diagram illustrating an example configuration of a prescribed period calculation circuit.
Figures 5, 6:
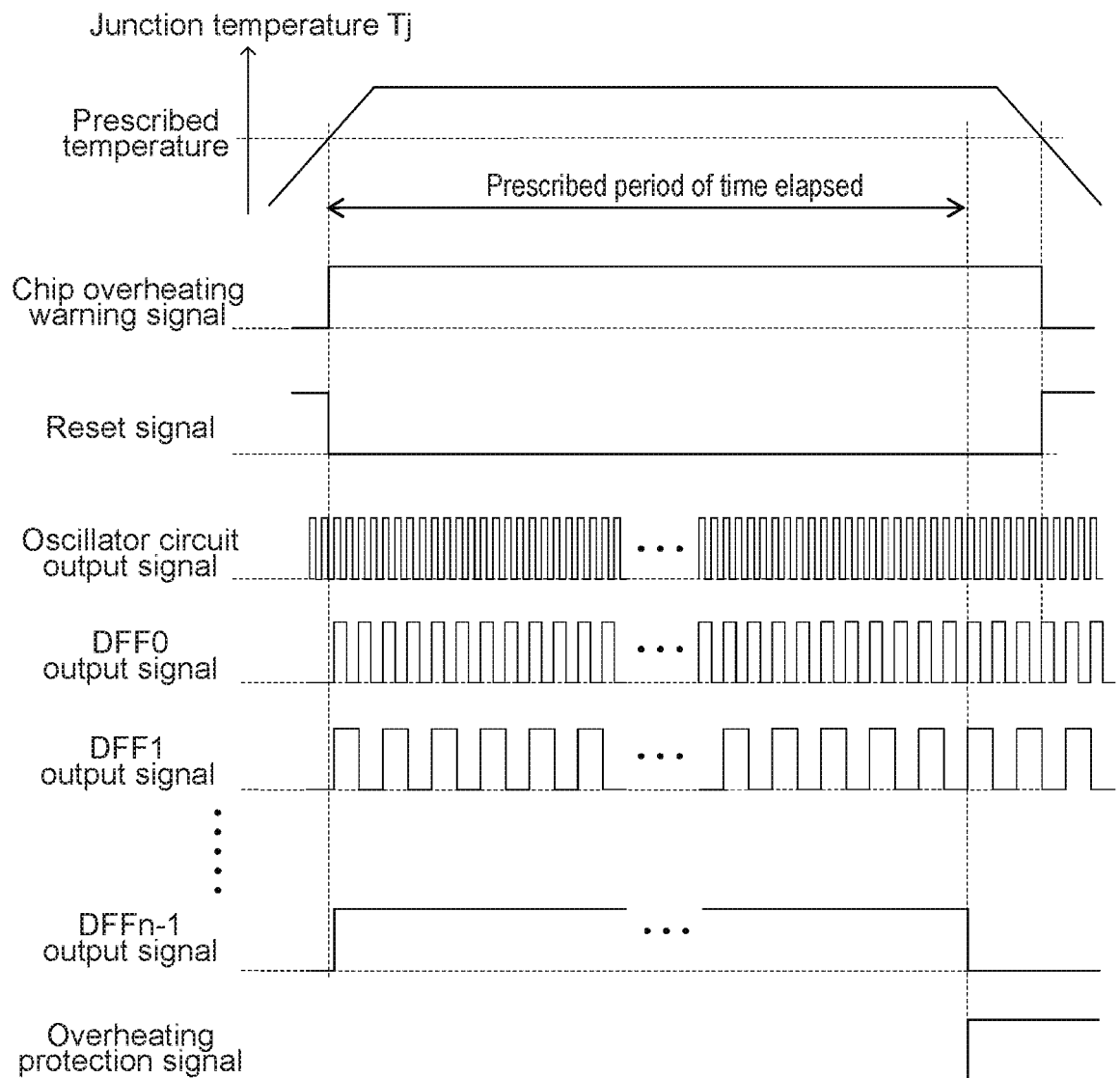
FIG. 5 shows the logical values at relevant parts for explaining the operation of the prescribed period calculation circuit.
FIG. 6 is a timing chart illustrating the operation of the prescribed period calculation circuit.

FIG. 4 is a circuit diagram illustrating an example configuration of the prescribed period calculation circuit. FIG. 5 shows the logical values at relevant parts for explaining the operation of the prescribed period calculation circuit. FIG. 6 is a timing chart illustrating the operation of the prescribed period calculation circuit.

As illustrated in FIG. 4, the prescribed period calculation circuit 14a includes a counter circuit 21, an oscillator circuit 22, a NOT circuit 23, an XOR circuit 24, and an AND circuit 25. An input terminal of the prescribed period calculation circuit 14a is connected to the output terminal of the comparator 12c of the chip temperature detection circuit 12, and the output terminal of the prescribed period calculation circuit 14a is connected to one of the input terminals of the OR circuit 14d.

In the prescribed period calculation circuit 14a, the counter circuit 21 includes n units of D flip-flops DFF0 to DFFn−1, which are cascade-connected. In other words, in the D flip-flops DFF0 to DFFn−1, each inverted output terminal (QB) is connected to the respective input terminal (D), while the clock input terminal (CLK) is used as a data input terminal and the output terminal (Q) is used as a data output terminal. The clock input terminal of the first-stage D flip-flop DFF0 is connected to an output terminal of the oscillator circuit 22, and the output terminal (Q) of the last-stage D flip-flop DFFn−1 is connected to one input terminal of the XOR circuit 24. The reset input terminal (RST) of each of the D flip-flops DFF0 to DFFn−1 is connected to an output terminal of the NOT circuit 23, and an input terminal of the NOT circuit 23 is connected to the input terminal of the prescribed period calculation circuit 14a. In the present embodiment, this NOT circuit 23 functions as a reset circuit. The input terminal of the prescribed period calculation circuit 14a is further connected to the other input terminal of the XOR circuit 24 and to one input terminal of the AND circuit 25, and the other input terminal of the AND circuit 25 is connected to an output terminal of the XOR circuit 24. The output terminal of the AND circuit 25 constitutes the output terminal of the prescribed period calculation circuit 14a. Here, the prescribed period that is calculated by the prescribed period calculation circuit 14a is determined by the oscillation frequency of the oscillator circuit 22 and by the value of n (the number of stages in the counter circuit 21).

As illustrated in FIGS. 5 and 6, in the prescribed period calculation circuit 14a, during low-temperature operation in which the junction temperature Tj of the IGBT chip 1a is lower than a warning threshold temperature that corresponds to the warning detection threshold voltage Vthwh, the chip overheating warning signal output by the comparator 12c is at the L level. Therefore, the AND circuit 25, in which this L-level chip overheating warning signal is input to the one input terminal, outputs an L-level overheating protection signal.

When the junction temperature Tj of the IGBT chip 1a reaches the warning threshold temperature that corresponds to the warning detection threshold voltage Vthwh and the comparator 12c outputs an H-level chip overheating warning signal, the NOT circuit 23 to which this H-level chip overheating warning signal is input outputs an L-level signal. As a result, the D flip-flops DFF0 to DFFn−1 that receive this L-level signal at the reset input terminals (RST) thereof are reset, an L-level signal is output at the output terminals (Q), and an H-level signal is output at the inverted output terminals (QB).

Next, when the first-stage D flip-flop DFF0 receives at the clock input terminal (CLK) thereof an output signal from the oscillator circuit 22, at the timing of the rising edge of that signal, the H-level signal from the inverted output terminal (QB) is loaded into the input terminal (D) and stored. As a result, the D flip-flop DFF0 outputs an H-level signal at the output terminal (Q) thereof and supplies this signal to the clock input terminal (CLK) of the second-stage D flip-flop DFF1. Therefore, the second-stage D flip-flop DFF1 performs the same operation as the first-stage D flip-flop DFF0, this same operation is repeated up through the last-stage D flip-flop DFFn−1, and this last-stage D flip-flop DFFn−1 outputs an H-level signal. Note that although there is a certain amount of delay time from when all of the D flip-flops DFF0 to DFFn−1 are reset until when the H-level signals are output from the output terminals (Q), here, the effects of this delay time are treated as being negligible.

At this time, the XOR circuit 24 takes as input the H-level chip overheating warning signal and the output signal of the D flip-flops DFF0 to DFFn−1 and therefore outputs an L-level signal. As a result, the AND circuit 25 which receives this L-level signal at the other input terminal thereof outputs an L-level signal.

Then, in synchronization with the timing of the rising edges of the output signal of the oscillator circuit 22, the D flip-flops DFF0 to DFFn−1 progressively performs frequency divisions on the output signal of the oscillator circuit 22. Once a prescribed period of time elapses from when the chip overheating warning signal was input, the counter circuit 21 completes its count-up operation and the last-stage D flip-flop DFFn−1 outputs an L-level signal. As a result, the XOR circuit 24 takes as input the H-level chip overheating warning signal and the L-level signal from the D flip-flop DFFn−1 and outputs an H-level signal. This H-level signal is input to the AND circuit 25 along with the H-level chip overheating warning signal, and therefore the AND circuit 25 outputs an H-level overheating protection signal (abnormality detection signal).

Note that if the chip overheating warning signal takes the L level before the prescribed period of time elapses, at that point the D flip-flops DFF0 to DFFn−1 are reset and the control IC 10 resumes low-temperature operation.

Figure 7:
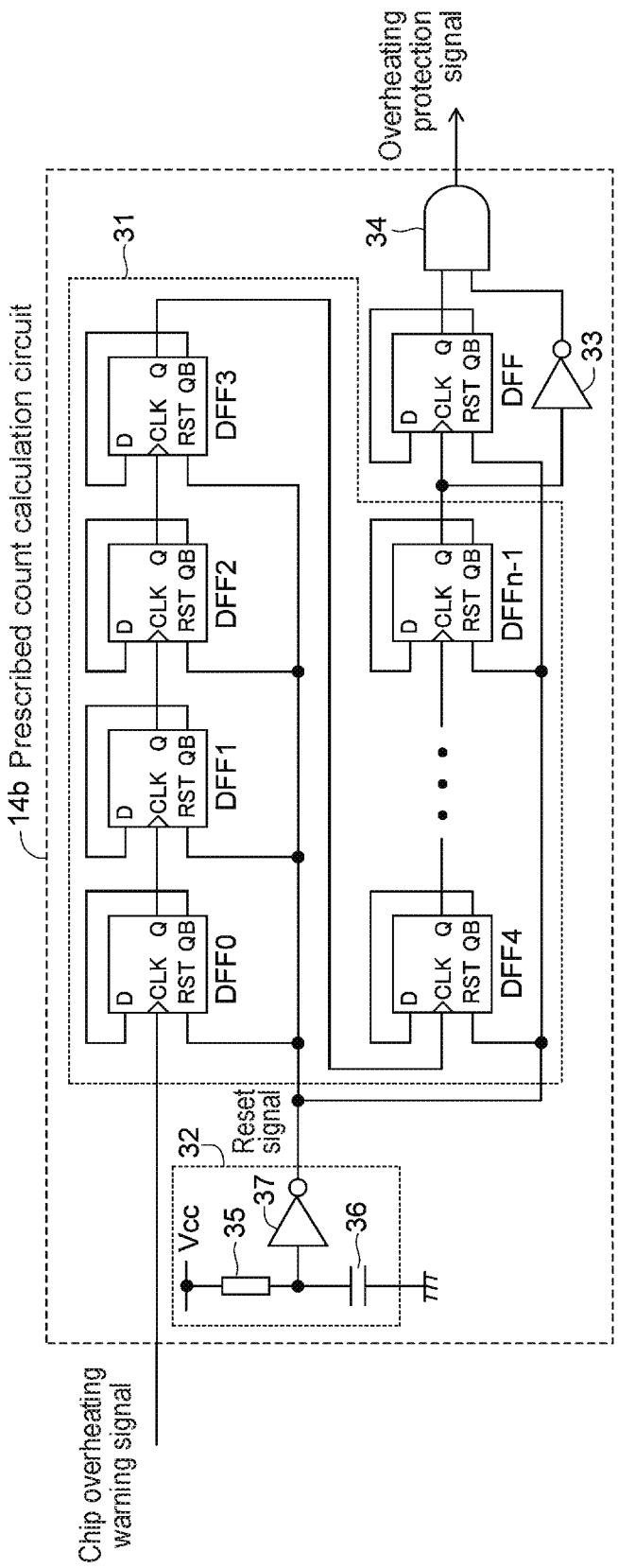
FIG. 7 is a circuit diagram illustrating an example configuration of a prescribed count calculation circuit.
Figures 8, 9:
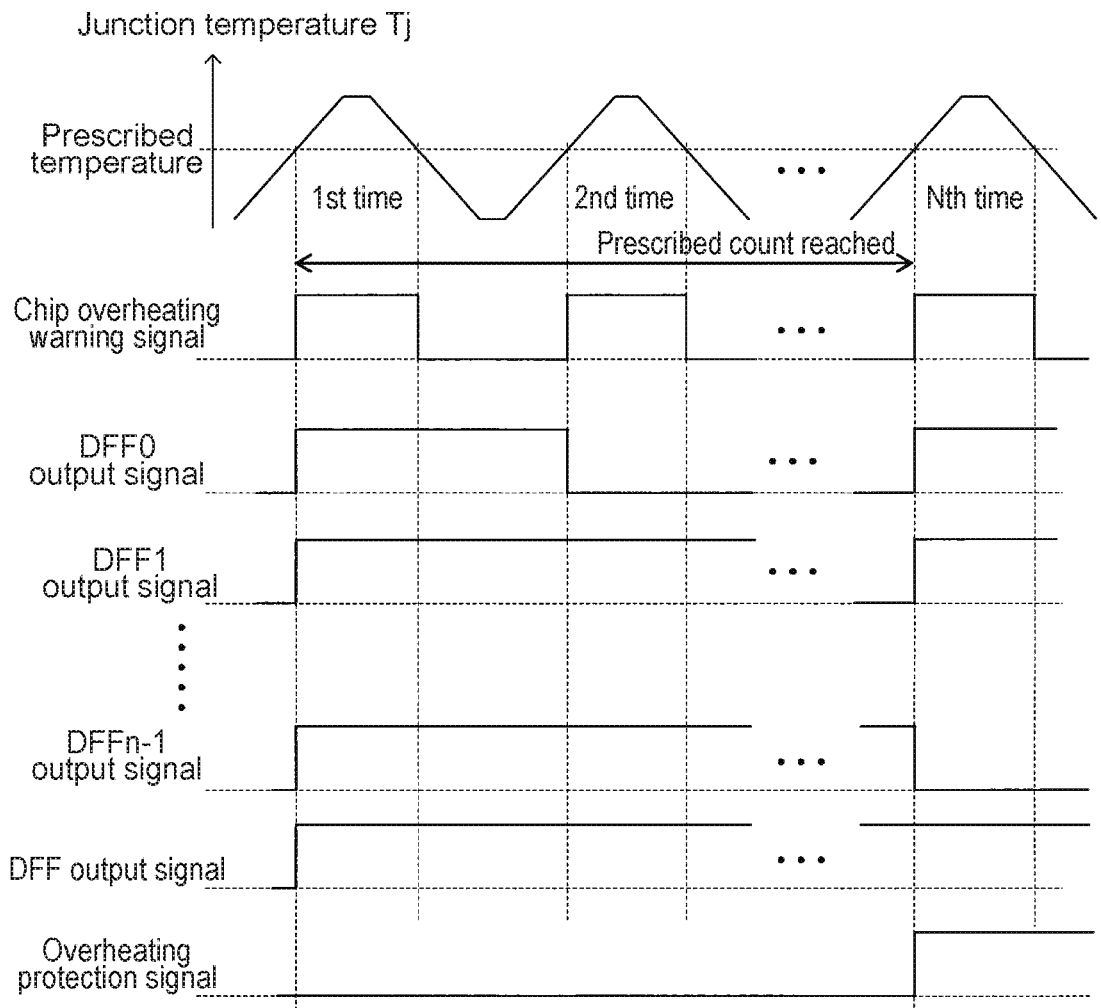
FIG. 8 shows the logical values at relevant parts for explaining the operation of the prescribed count calculation circuit.
FIG. 9 is a timing chart illustrating the operation of the prescribed count calculation circuit.

FIG. 7 is a circuit diagram illustrating an example configuration of the prescribed count calculation circuit. FIG. 8 shows the logical values at relevant parts for explaining the operation of the prescribed count calculation circuit. FIG. 9 is a timing chart illustrating the operation of the prescribed count calculation circuit. Note that in FIG. 7, the D flip-flops that form a counter circuit are given the same reference characters as the D flip-flops DFF0 to DFFn−1 in the counter circuit 21 in FIG. 4, and a detailed description of these D flip-flops will be omitted here.

As illustrated in FIG. 7, the prescribed count calculation circuit 14b includes a counter circuit 31, a reset circuit 32, a D flip-flop DFF, a NOT circuit 33, and an AND circuit 34. An input terminal of the prescribed count calculation circuit 14b is connected to the output terminal of the comparator 12c of the chip temperature detection circuit 12, and the output terminal of the prescribed count calculation circuit 14b is connected to one of the input terminals of the OR circuit 14d.

In the prescribed count calculation circuit 14b, the reset circuit 32 includes a resistor 35, a capacitor 36, and a NOT circuit 37. One terminal of the resistor 35 is connected to the internal power supply Vcc, while the other terminal of the resistor 35 is connected to one terminal of the capacitor 36 and to an input terminal of the NOT circuit 37, and the other terminal of the capacitor 36 is connected to ground. An output terminal of the NOT circuit 37 is connected to the reset input terminals of the D flip-flop DFF and the D flip-flops DFF0 to DFFn−1 of the counter circuit 31. An output terminal of the counter circuit 31 is connected to the clock input terminal (CLK) of the D flip-flop DFF and to an input terminal of the NOT circuit 33. The output terminal (Q) of the D flip-flop DFF and an output terminal of the NOT circuit 33 are connected to input terminals of the AND circuit 34, and an output terminal of the AND circuit 34 constitutes the output terminal of the prescribed count calculation circuit 14b. Here, the prescribed count that is calculated by the prescribed count calculation circuit 14b is determined by the value of n (the number of stages in the counter 31).

In the prescribed count calculation circuit 14b, when the power is turned on, the capacitor 36 of the reset circuit 32 is charged via the resistor 35 by the internal power supply Vcc. Once the charge voltage of the capacitor 36 exceeds the threshold voltage of the NOT circuit 37, the reset circuit 32 outputs an L-level reset signal. This L-level reset signal is supplied to the reset input terminals (RST) of the D flip-flop DFF and the D flip-flops DFF0 to DFFn−1 of the counter circuit 31. As a result, the D flip-flop DFF and the D flip-flops DFF0 to DFFn−1 of the counter circuit 31 are each reset. At this time, the AND circuit 34 takes an L-level signal from the D flip-flop DFF as input and therefore outputs an L-level overheating protection signal.

As illustrated in FIGS. 8 and 9, here, during low-temperature operation in which the junction temperature Tj of the IGBT chip 1a is lower than a preset threshold temperature that corresponds to the warning detection threshold voltage Vthwh, the chip overheating warning signal output by the comparator 12c is at the L level. The D flip-flop DFF and the D flip-flops DFF0 to DFFn−1 of the counter circuit 31 that receive this L-level chip overheating warning signal respectively remain in the reset state.

When the junction temperature Tj of the IGBT chip 1a reaches the prescribed temperature that corresponds to the warning detection threshold voltage Vthwh and the comparator 12c outputs an H-level chip overheating warning signal, this chip overheating warning signal is input to the prescribed count calculation circuit 14b. In the prescribed count calculation circuit 14b, the chip overheating warning signal is input to the clock input terminal (CLK) of the D flip-flop DFF0 of the counter circuit 31. In the D flip-flop DFF0, at the timing of the rising edge of the chip overheating warning signal, an H-level signal from the inverted output terminal (QB) is loaded into the input terminal (D) and stored. As a result, the D flip-flop DFF0 outputs an H-level signal at the output terminal (Q) thereof and supplies this signal to the clock input terminal (CLK) of the second-stage D flip-flop DFF1. Therefore, the second-stage D flip-flop DFF1 performs the same operation as the first-stage D flip-flop DFF0, and this same operation is repeated up through the D flip-flop DFF that is connected to the output terminal of the counter circuit 31. As a result, the counter circuit 31 and the D flip-flop DFF each output an H-level signal.

At this time, the NOT circuit 33 logically inverts the output signal from the counter circuit 31 and inputs the resulting L-level signal to one input terminal of the AND circuit 34, which therefore outputs an L-level overheating protection signal.

Then, when the junction temperature Tj of the IGBT chip 1a decreases to below the prescribed temperature that corresponds to the warning detection threshold voltage Vthwh, the comparator 12c outputs an L-level signal. In this case, even when this L-level signal is input to the prescribed count calculation circuit 14b, there is no change in the operation of the prescribed count calculation circuit 14b.

Next, when the junction temperature Tj of the IGBT chip 1a once again reaches the prescribed temperature that corresponds to the warning detection threshold voltage Vthwh and the comparator 12c outputs an H-level chip overheating warning signal, this chip overheating warning signal is input to the prescribed count calculation circuit 14b. In the prescribed count calculation circuit 14b, in synchronization with the timing of the rising edge of this chip overheating warning signal that was input for the second time, just the output of the first-stage D flip-flop DFF0 is inverted.

After this, each time that the junction temperature Tj of the IGBT chip 1a exceeds the preset threshold temperature that corresponds to the warning detection threshold voltage Vthwh, the counter circuit 31 takes the resulting chip overheating warning signal as input as a CLK signal and counts the number of times that the chip overheating warning signal has been input.

When the number of times that the chip overheating warning signal has been input reaches a prescribed count N, the counter circuit 31 outputs an L-level signal. As a result, the H-level signal from the D flip-flop DFF and an H-level signal from the NOT circuit 33 that has inverted the output signal of the counter circuit 31 are input to the AND circuit 34, which therefore outputs an H-level overheating protection signal (abnormality detection signal).

Figure 10:
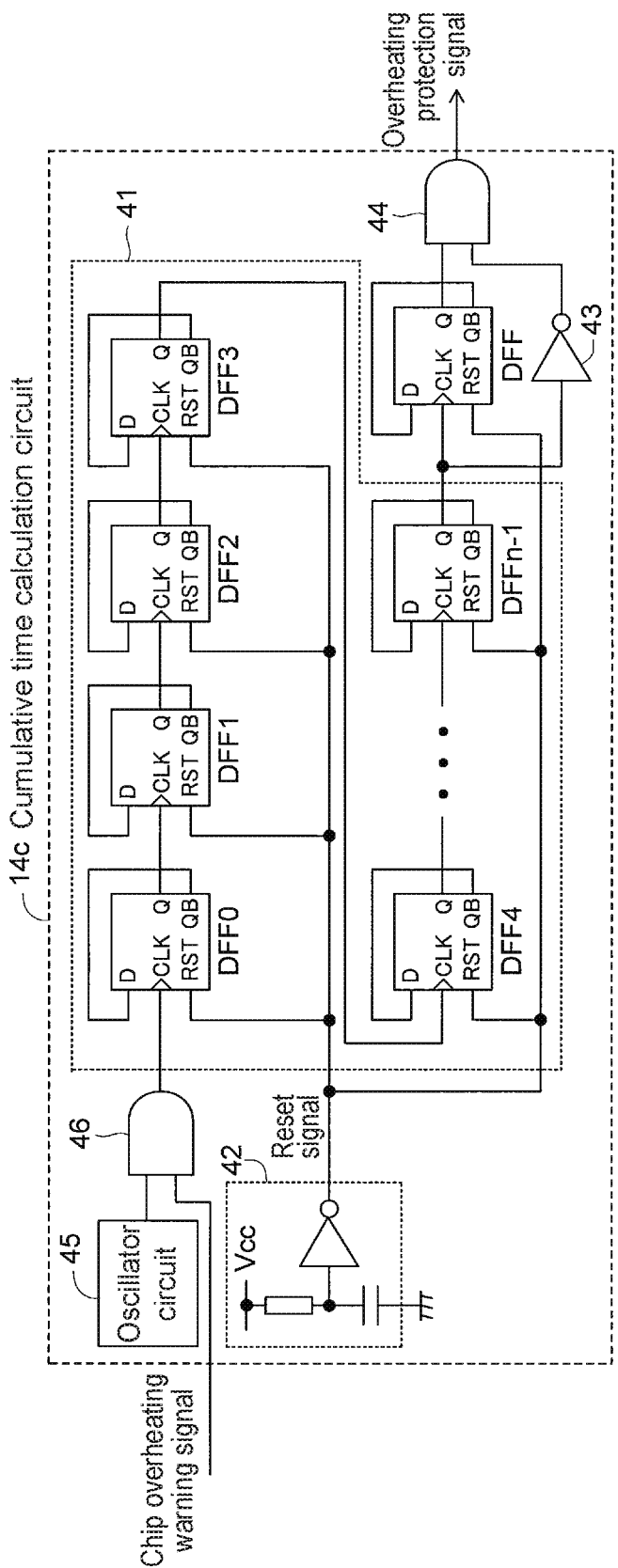
FIG. 10 is a circuit diagram illustrating an example configuration of a cumulative time calculation circuit.
Figure 12:
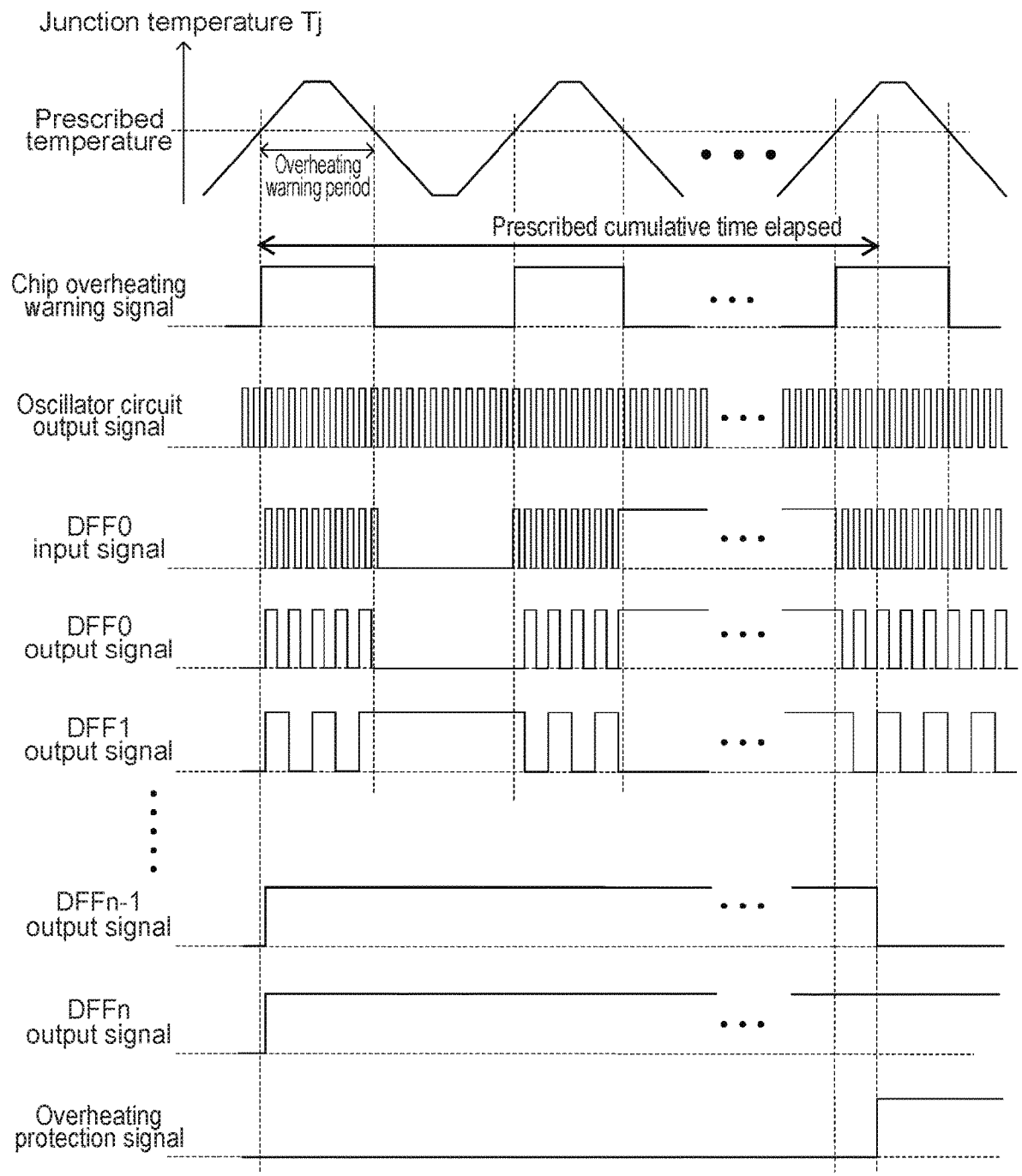
FIG. 12 is a timing chart illustrating the operation of the cumulative time calculation circuit.

FIG. 10 is a circuit diagram illustrating an example configuration of the cumulative time calculation circuit. FIG. 11 shows the logical values at relevant parts for explaining the operation of the cumulative time calculation circuit. FIG. 12 is a timing chart illustrating the operation of the cumulative time calculation circuit.

As illustrated in FIG. 10, the cumulative time calculation circuit 14c has a configuration in which an oscillator circuit 45 and an AND circuit 46 have been added to the prescribed count calculation circuit 14b. In other words, the cumulative time calculation circuit 14c includes a counter circuit 41, a reset circuit 42, a D flip-flop DFF, a NOT circuit 43, and an AND circuit 44 which are configured the same as in the prescribed count calculation circuit 14b, as well as the oscillator circuit 45 and the AND circuit 46. An input terminal of the cumulative time calculation circuit 14c is connected to the output terminal of the comparator 12c of the chip temperature detection circuit 12, and the output terminal of the cumulative time calculation circuit 14c is connected to one of the input terminals of the OR circuit 14d.

The input terminal of the cumulative time calculation circuit 14c is connected to one input terminal of the AND circuit 46, while the other input terminal of the AND circuit 46 is connected to an output terminal of the oscillator 45, and an output terminal of the AND circuit 46 is connected to the clock input terminal (CLK) of the first-stage D flip-flop DFF0 of the counter circuit 41. Here, the cumulation time that is calculated by the cumulative time calculation circuit 14c is determined by the oscillation frequency of the oscillator circuit 45 and by the value of n (the number of stages in the counter circuit 41).

In the cumulative time calculation circuit 14c, when the power is turned on, an L-level chip overheating warning signal is input from the comparator 12c of the chip temperature detection circuit 12, and therefore the AND circuit 46 prevents an output signal from the oscillator circuit 45 from being supplied to the counter circuit 41. The reset circuit 42 outputs an L-level reset signal after a prescribed period of time has elapsed from when the power was turned on, thereby resetting the D flip-flop DFF and the D flip-flops DFF0 to DFFn−1 of the counter circuit 41. As a result, the counter circuit 41 and the D flip-flop DFF each output an L-level signal. At this time, the AND circuit 44 takes the L-level signal from the D flip-flop DFF as input and therefore outputs an L-level overheating protection signal.

Here, during low-temperature operation in which the junction temperature Tj of the IGBT chip 1a is lower than the prescribed temperature that corresponds to the warning detection threshold voltage Vthwh, the chip overheating warning signal output by the comparator 12c remains at the L level. Therefore, as illustrated in FIGS. 11 and 12, the output signals of the D flip-flop DFFn−1 of the counter circuit 41, the D flip-flop DFF, and the AND circuit 44 are at the L level at this time.

When the junction temperature Tj of the IGBT chip 1a reaches the prescribed temperature that corresponds to the warning detection threshold voltage Vthwh and the comparator 12c outputs an H-level chip overheating warning signal, this chip overheating warning signal is input to the one input terminal of the AND circuit 46. As a result, the output signal of the oscillator circuit 45 is input to the counter circuit 41, and the counter circuit 41 begins counting the output signal of the oscillator circuit 45. This counting of the output signal of the oscillator circuit 45 is continued for the duration of the overheating warning period during which the H-level chip overheating warning signal is being input.

Next, when the junction temperature Tj of the IGBT chip 1a exceeds the prescribed temperature, the AND circuit 46 allows the output signal of the oscillator circuit 45 to pass through, and the counter 41 resumes counting by adding to the previous count value.

In this way, by counting the output signal of the oscillator circuit 45 only during the overheating warning period in which an H-level chip overheating warning signal is being input, it is possible to calculate the cumulative overheating warning period.

Here, if a prescribed cumulative time elapses while counting the output signal of the oscillator circuit 45, the last-stage D flip-flop DFFn−1 of the counter circuit 41 outputs an L-level signal. As a result, an H-level signal from the D flip-flop DFF and an H-level signal from the NOT circuit 43 that has inverted the output signal of the D flip-flop DFFn−1 are input to the AND circuit 44, which therefore outputs an H-level overheating protection signal (abnormality detection signal).

Although the prescribed period calculation circuit 14a, the prescribed count calculation circuit 14b, and the cumulative time calculation circuit 14c as described above are part of the abnormality detection circuit 14 for protecting against chip overheating, the abnormality detection circuit 15 for protecting against case overheating has the same configuration.

Moreover, although in the embodiment of the semiconductor device described above the counter circuits 21, 31, and 41 of the prescribed period calculation circuit 14a, the prescribed count calculation circuit 14b, and the cumulative time calculation circuit 14c are constituted by rising edge-triggered D flip-flops, the present invention is not limited to this configuration. For example, the counter circuits 21, 31, and 41 may be constituted by falling edge-triggered D flip-flops, JK flip-flops, or the like.

Moreover, in this semiconductor device, the abnormality detection circuits 14 and 15 do not necessarily need to include all of the prescribed period calculation circuit, the prescribed count calculation circuit, and the cumulative time calculation circuit; and any of these circuits can be freely selected and used as necessary. Furthermore, although this semiconductor device includes both of the abnormality detection circuits 14 and 15, either one of these circuits may be included alone.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
   a power semiconductor device;
   a control IC including a driver circuit to drive the power semiconductor device and a protection circuit to protect the power semiconductor device;
   a case that houses the power semiconductor device and the control IC;
   a chip temperature detector connected to the control IC to measure a chip temperature of the power semiconductor device; and
   a case temperature detector connected to the control IC to measure a case temperature that is defined as a temperature at a portion of the semiconductor module other than the power semiconductor device,
   wherein the protection circuit in the control IC includes:
      a chip temperature detection circuit that, when the chip temperature rises and exceeds a first threshold, outputs a chip overheating warning signal so that a warning is communicated to a user, and, when the chip temperature further rises and exceeds a second threshold higher than the first threshold, outputs a chip overheating protection signal to the driver circuit so as to cause the driver circuit to stop switching operation of the power semiconductor device until the chip temperature returns to normal;

a case temperature detection circuit that, when the case temperature rises and exceeds a third threshold, outputs a case overheating warning signal so that a warning is communicated to the user, and, when the case temperature further rises and exceeds a fourth threshold higher than the third threshold, outputs a case overheating protection signal to the driver circuit so as to cause the driver circuit to stop switching operation of the power semiconductor device until the case temperature returns to normal; and an abnormality detection circuit connected to one of the chip temperature detection circuit and the case temperature detection circuit to receive the chip overheating warning signal or the case overheating warning signal, the abnormality detection circuit estimating power cycle life of the power semiconductor device by processing the received chip or case overheating warning signal, and, when the estimated power cycle life has reached a prescribed threshold, generates and outputs an abnormality detection signal to the driver circuit so as to cause the driver circuit to forcedly and permanently stop the switching operation of the power semiconductor device.

2. The semiconductor module according to claim 1, wherein the abnormality detection circuit includes at least one of a prescribed period calculation circuit that determines whether that the chip overheating warning signal or the case overheating warning signal has continued for more than a prescribed duration of time, a prescribed count calculation circuit that determines whether a number of times the abnormality detection circuit received the chip overheating warning signal or the case overheating warning signal has exceeded a prescribed count, and a cumulative time calculation circuit that determines whether a cumulative duration of periods in which the abnormality detection circuit received the chip overheating warning signal or the case overheating warning signal has reached a prescribed threshold cumulative duration.

3. The semiconductor module according to claim 2, wherein the abnormality detection circuit includes the prescribed period calculation circuit, and the prescribed period calculation circuit includes an oscillator circuit, a counter circuit that counts a number of pulses outputted from the oscillator circuit and that outputs the abnormality detection signal when the counted number reached a prescribed count, and a reset circuit that resets the count up timer every time the abnormality detection circuit receives the chip overheating warning signal or the case overheating warning signal is input.

4. The semiconductor module according to claim 2, wherein the abnormality detection circuit includes the prescribed count calculation circuit, and the prescribed count calculation circuit includes a counter circuit that counts a number of times the abnormality detection circuit received the chip overheating warning signal or the case overheating warning signal and outputs the abnormality detection signal when the counted number has reached the prescribed count, and a reset circuit that resets the counter circuit when the semiconductor module is initially powered on.

5. The semiconductor module according to claim 2, wherein the cumulative time calculation circuit includes an oscillator circuit, a counter circuit that counts a number of pulses received from the oscillator circuit and that outputs the abnormality detection signal when the counted number has reached a prescribed threshold, a reset circuit that resets the counter circuit when the semiconductor module is initially powered on, and an AND circuit that is arranged between the oscillator circuit and the counter circuit and that allows the pulses by the oscillator circuit to be input to the counter circuit only while the abnormality detection circuit is receiving the chip overheating warning signal or the case overheating warning signal.

6. The semiconductor module according to claim 1, wherein the abnormality detection circuit is connected to the chip temperature detection circuit to receive the chip overheating warning, wherein the semiconductor module further comprises another abnormality detection circuit connected to the case temperature detection circuit to receive the case overheating warning signal, the another abnormality detection circuit estimating the power cycle life of the power semiconductor device by processing the received case overheating warning signal, and, when the estimated power cycle life has reached a prescribed threshold, generates and outputs another abnormality detection signal to the driver circuit so as to cause the driver circuit to forcedly and permanently stop the switching operation of the power semiconductor device, and wherein the driver circuit forcedly and permanently stops the switching operation of the power semiconductor device when at least one of the abnormality detection signal and said another abnormality detection signal is generated.

7. The semiconductor module according to claim 6, wherein the abnormality detection circuit includes at least one of a prescribed period calculation circuit that determines whether that the chip overheating warning signal has continued for more than a prescribed duration of time, a prescribed count calculation circuit that determines whether a number of times the abnormality detection circuit received the chip overheating warning signal has exceeded a prescribed count, and a cumulative time calculation circuit that determines whether a cumulative duration of periods in which the abnormality detection circuit received the chip overheating warning signal has reached a prescribed threshold cumulative duration, and wherein the another abnormality detection circuit includes at least one of a prescribed period calculation circuit that determines whether that the case overheating warning signal has continued for more than a prescribed duration of time, a prescribed count calculation circuit that determines whether a number of times the abnormality detection circuit received the case overheating warning signal has exceeded a prescribed count, and a cumulative time calculation circuit that determines whether a cumulative duration of periods in which the abnormality detection circuit received the case overheating warning signal has reached a prescribed threshold cumulative duration.

* * * * *